(12) United States Patent
Hong et al.

(10) Patent No.: US 10,153,349 B2
(45) Date of Patent: Dec. 11, 2018

(54) METHODS AND STRUCTURES FOR A SPLIT GATE MEMORY CELL STRUCTURE

(71) Applicant: NXP USA, INC., Austin, TX (US)

(72) Inventors: Cheong Min Hong, Austin, TX (US); Sung-Taeg Kang, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/413,449

(22) Filed: Jan. 24, 2017

(65) Prior Publication Data

US 2017/0194444 A1      Jul. 6, 2017

Related U.S. Application Data

(62) Division of application No. 13/929,924, filed on Jun. 28, 2013, now Pat. No. 9,590,058.

(51) Int. Cl.

| | |
|---|---|
| *H01L 29/423* | (2006.01) |
| *H01L 29/66* | (2006.01) |
| *H01L 21/28* | (2006.01) |
| *H01L 27/105* | (2006.01) |
| *H01L 27/11536* | (2017.01) |
| *H01L 29/788* | (2006.01) |
| *H01L 21/285* | (2006.01) |
| *H01L 29/45* | (2006.01) |

(52) U.S. Cl.
CPC .. *H01L 29/42328* (2013.01); *H01L 21/28273* (2013.01); *H01L 21/28282* (2013.01); *H01L 21/28518* (2013.01); *H01L 27/105* (2013.01); *H01L 27/11536* (2013.01); *H01L 29/42332* (2013.01); *H01L 29/45* (2013.01); *H01L 29/66825* (2013.01); *H01L 29/66833* (2013.01); *H01L 29/7881* (2013.01); *H01L 29/7882* (2013.01)

(58) Field of Classification Search
None
See application file for complete search history.

(56) References Cited

U.S. PATENT DOCUMENTS

| | | | |
|---|---|---|---|
| 7,838,363 B2 | 11/2010 | Steimle et al. | |
| 7,863,670 B2 | 1/2011 | Ishii et al. | |
| 8,034,670 B2 | 10/2011 | Phua et al. | |
| 8,035,155 B2 | 10/2011 | Sakai | |
| 8,048,738 B1 | 11/2011 | Kang et al. | |
| 8,530,950 B1 | 9/2013 | Kang et al. | |
| 2009/0108325 A1* | 4/2009 | Kang | H01L 27/115 257/316 |
| 2010/0244121 A1* | 9/2010 | Loiko | B82Y 10/00 257/325 |

FOREIGN PATENT DOCUMENTS

CN           101401200 A           7/2011

* cited by examiner

*Primary Examiner* — Michelle Mandala

(57) ABSTRACT

A method of forming a split gate memory cell structure using a substrate includes forming a gate stack comprising a select gate and a dielectric portion overlying the select gate. A charge storage layer is formed over the substrate including over the gate stack. A first sidewall spacer of conductive material is formed along a first sidewall of the gate stack extending past a top of the select gate. A second sidewall spacer of dielectric material is formed along the first sidewall on the first sidewall spacer. A portion of the first sidewall spacer is silicided using the second sidewall spacer as a mask whereby silicide does not extend to the charge storage layer.

19 Claims, 4 Drawing Sheets

US 10,153,349 B2

METHODS AND STRUCTURES FOR A SPLIT GATE MEMORY CELL STRUCTURE

This application is a divisional application of a U.S. patent application entitled "Methods and Structures for a Split Gate Memory Cell Structure", having a serial number of Ser. No. 13/929,924, having a filing date of Jun. 28, 2013, having common inventors, and having a common assignee, all of which is incorporated by reference in its entirety.

BACKGROUND

Field

This disclosure relates generally to semiconductor structures, and more specifically, to split gate memory cell structures.

Related Art

Split gate memory cell structures, which include both a select gate and a control gate, are typically used as bitcell storage devices within nonvolatile memory arrays. The use of a separate select gate for the bitcells in such arrays allows for improved isolation and reduced bitcell disturb during programming and reading of the bitcells. In split gate memory cells, the gap region between select gate and control gate is a weak spot for voltage breakdown. The region is subjected to repeated high erase voltage during non-volatile memory cell operation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of methods and semiconductor devices disclosed herein provide a split gate memory cell for a memory device that solves the problem of voltage breakdown in a gap between a select gate and a control gate by increasing the spacing between the silicide on the control gate from the sidewall of the select gate and increasing the spacing between the silicide on the control gate and the silicide of the source region. These increased spacings help prevent voltage breakdown in the split gate memory cell.

Figure 1:
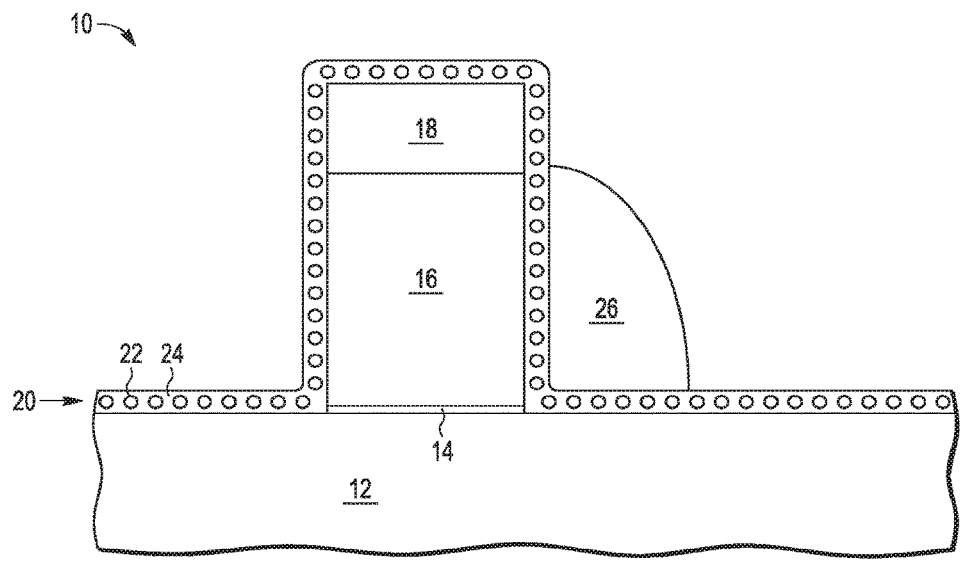
FIG. 1 illustrates a semiconductor device at a stage in processing, in accordance with one embodiment.

FIG. 1 shows a cross-sectional view of an embodiment of a semiconductor device 10 such as a split gate memory cell during an intermediate stage of manufacture in which a select gate structure includes gate dielectric layer 14, select gate layer 16, and dielectric layer 18 formed in layers on substrate 12. Dielectric layer 18 has a different etch selectivity than select gate 16 and charge storage layer 20 and can be silicon nitride, silicon oxynitride or other suitable material. Charge storage layer 20 is formed over the select gate structure and exposed portions of substrate 12. Charge storage layer 20 may have any suitable structure, such as, for example, a continuous charge storage layer such as floating gate, or discrete storage layer including nanocrystals or silicon nitride. In the illustrated embodiment, charge storage layer 20 includes nanocrystals 22 within a dielectric material 24. In alternate embodiments, charge storage layer 20 may include a single nitride layer, a trap oxide layer, or may include a stack of different layers. Control gate 26 is formed on a portion of charge storage layer 20 adjacent to select gate 16.

Semiconductor substrate 12 described herein can be any semiconductor material or combinations of materials, such as gallium arsenide, silicon germanium, silicon-on-insulator (SOI), silicon, monocrystalline silicon, the like, and combinations of the above. Semiconductor substrate 12 may also be referred to as a semiconductor layer. Gate dielectric layer 14 is on substrate 12. Select gate layer 16 is formed over gate dielectric layer 14. Dielectric layer 18 is formed over select gate layer 16. Dielectric layer 18 may be an anti-reflective coating (ARC) layer and may include, for example, nitride. In one embodiment, dielectric layer 18 may include multiple dielectric layers. In one embodiment, a total thickness of dielectric layer 18 is in a range of 20 to 40 nanometers. Gate dielectric layer 14 may be any appropriate gate dielectric layer, such as, for example, a gate oxide layer. Select gate layer 16 is a conductive layer and may be, for example, polysilicon. Alternatively, select gate layer 16 may also be a metal, titanium nitride, or a combination of materials. In one embodiment, a layer of gate dielectric material is formed on substrate 12, a layer of select gate material is formed over the layer of gate dielectric material, and a layer of dielectric material may be formed over the layer of gate dielectric material. These layers may then be patterned to form a gate stack, which includes dielectric layer 18 and select gate layer 16, in which the bottom surface of dielectric layer 18 is on the top surface of select gate layer 16. The gate stack can therefore be formed using one or more dry etch steps such as a breakthrough etch of an anti-reflective coating (which may be dielectric layer 18) and a main etch which etches through the material of select gate layer 16 (such as, for example, carbon fluoride, in the case that select gate layer 16 is polysilicon). The etch chemistry may also include an oxidizing agent. The oxidizing agent may include for example, oxygen ($O_2$) or helium oxide ($HeO_2$). Note that select gate layer 16 may also be referred to as a select gate structure, select gate, or select gate electrode.

Charge storage layer 20 can be formed by growing an oxide on exposed portions of substrate 12 and along sidewalls of the select gate structure. In one embodiment, oxide is grown to a thickness in a range of approximately 4 to 10 nanometers. After formation of oxide, nanocrystals 22 and an insulating layer surrounding nanocrystals 22 are formed over the oxide layer and select gate 16. Therefore, dielectric 24 may include the oxide layer and the insulating layer surrounding nanocrystals 22. In one embodiment, nanocrystals 22 have diameters in a range of approximately 3 to 20 nanometers. Conventional processing may be used to form nanocrystals 22. Nanocrystals 22 may include any type of conductive material, such as, for example, silicon, germanium, a metal, silicide, alloy, or the like. The insulating layer that is formed over and surrounding nanocrystals 20 may also be an oxide layer. Alternatively, the insulating layer may include hafnium oxide, aluminum oxide, etc. In one embodiment, the insulating layer has a thickness in a range of 8 to 20 nanometers. Therefore, note that the nanocrystals 22 and dielectric material 24 form charge storage layer 20. In one embodiment, charge storage layer 20 has a total thickness in a range of approximately 12 to 30 nanometers. Therefore, in one embodiment, charge storage layer 20 may be referred to as a thin storage layer which has a thickness of at most approximately 30 nanometers. Note that a portion of charge storage layer 20 is formed over substrate 12 and another portion of charge storage layer 20 is formed along the sidewalls of select gate layer 16 and dielectric layer 18. Storage layer 20 could also be another storage material such as polysilicon surrounded by a dielectric or nitride. Nanocrystals 22 can also be called nanoclusters or nanodots and are typically of silicon.

Control gate electrode 26 (also referred to as a control gate) is formed adjacent to a first sidewall of select gate structure 16 on charge storage layer 20 over substrate 12. Control gate electrode 26 may include polysilicon, a metal, titanium nitride, etc., or combinations thereof and can be formed using conventional deposition techniques such as by depositing a layer of polysilicon, which is conformal, and then performing an anisotropic etch on the conformal layer. Therefore, control gate electrode 26 may also be referred to as a sidewall spacer or a conductive spacer. The conformal layer should be either conductive or able to become conductive. In the case of polysilicon, the material is doped in order to be more conductive. The doping typically occurs by implants after deposition but could be by in situ doping or a combination of in situ doping and subsequent implants. Note that the anisotropic etch of the conformal layer also results in a second sidewall spacer adjacent a second sidewall of select gate structure 16 on charge storage layer 20 over substrate 12, opposite control gate 26. However, in the illustrated embodiment, a masking layer may be formed over control gate 26 and the second control gate may then be removed. The height of control gate 26 is at least as great as the height of select gate 16. In one embodiment, the top surface of control gate 26 is above a top surface of select gate 16 but below a top surface of dielectric layer 18.

Figure 2:
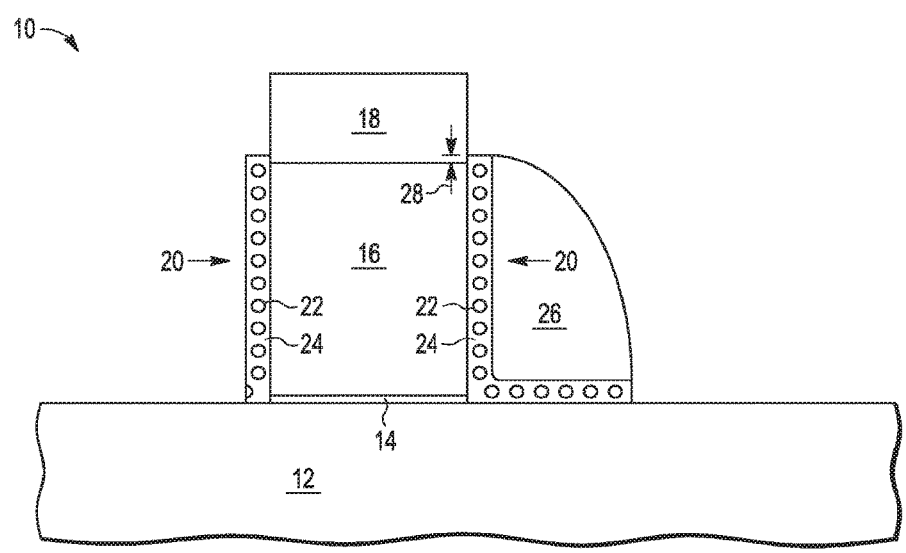
FIG. 2 illustrates the semiconductor device of FIG. 1 at a subsequent stage in processing, in accordance with one embodiment.

FIG. 2 shows a cross-sectional view of semiconductor device 10 during a subsequent stage of manufacture in which an etch is performed to remove portions of charge storage layer 20, such that a portion of charge storage layer 20 remains between control gate 26 and select gate 16 and between control gate 26 and substrate 12. In the vertical direction, the height of the remaining portion of charge storage layer 20 is at least as great as the height of control gate 26, and thus at least as great as the height of select gate 16, after the etch process. In the horizontal direction, the width of the remaining portion of charge storage layer 20 is less than the width of control gate 26 after the etch process. Note that dimension 28 in the vertical direction illustrates the difference in height between the height of select gate 16 and the height of the remaining portion of charge storage layer 20 between select gate 16 and control gate 26. In the illustrated embodiment, the height of the remaining portion of charge storage layer 20 is the same as the height of control gate 26, therefore, dimension 28 may also represent the difference in height between select gate 16 and control gate 26. In one embodiment, dimension 28 is at least 3 nanometers. Alternatively, dimension 28 may be in a range of 3 to 10 nanometers.

Figure 3:
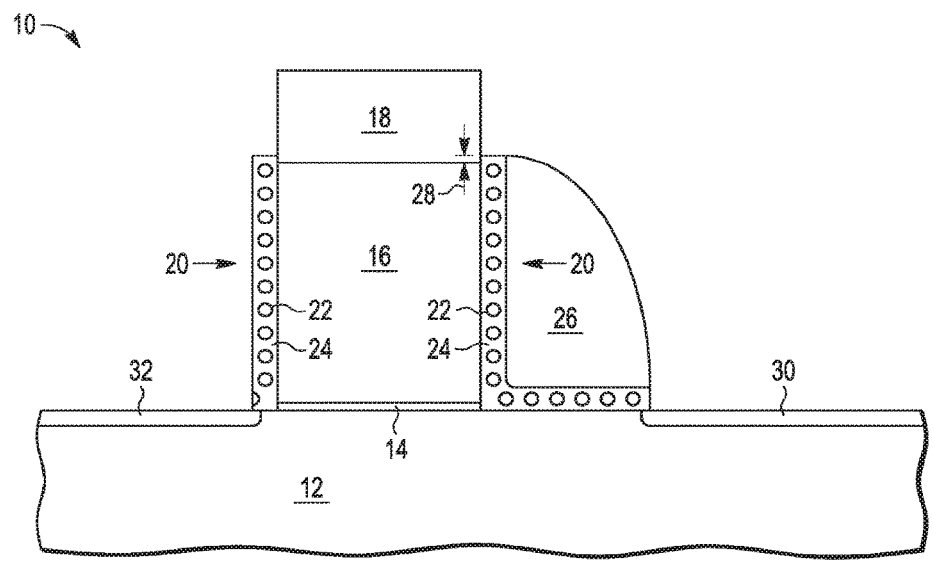
FIG. 3 illustrates the semiconductor device of FIG. 2 at a subsequent stage in processing, in accordance with one embodiment.

FIG. 3 shows a cross-sectional view of semiconductor device 10 during a subsequent stage of manufacture in which an implant is performed using the gate stack and control electrode 26 as an implant mask to form shallow source/drain extension regions 32 and 30 in substrate 12. Region 32 is formed in substrate 12 adjacent charge storage layer 20 which is formed along the second sidewall of select gate 16, and region 30 is formed in substrate 12 adjacent control gate 26. Therefore, note that select gate 16 and control gate 26 are located between regions 32 and 30. Region 32 and 30 may also be referred to as extension regions.

Figure 4:
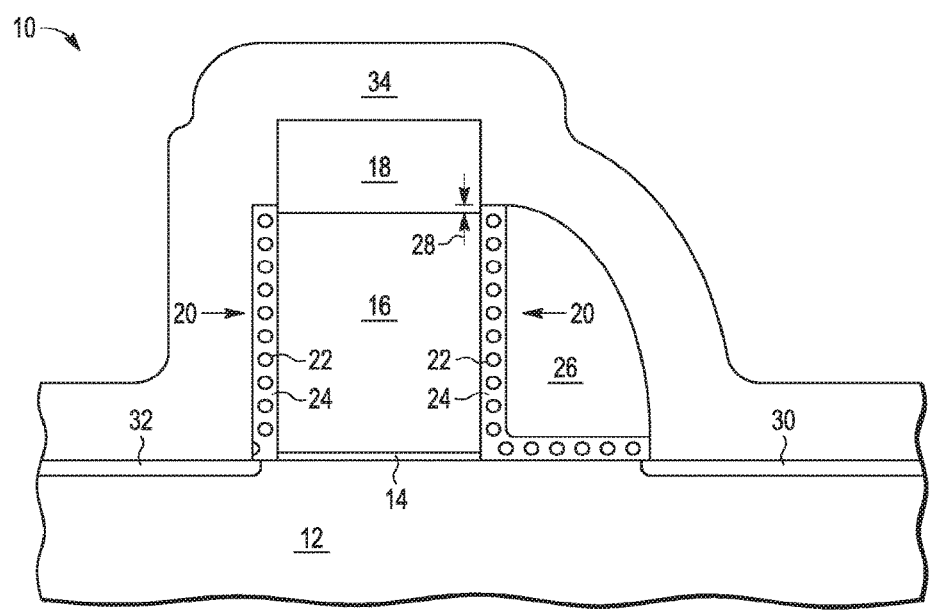
FIG. 4 illustrates the semiconductor device of FIG. 3 at a subsequent stage in processing, in accordance with one embodiment.

FIG. 4 shows a cross-sectional view of semiconductor device 10 during a subsequent stage of manufacture in which a dielectric layer 34 is formed over substrate 12, charge storage layer 20, dielectric 18, select gate 16, and control gate 26. In one embodiment, dielectric layer 34 is a conformal layer that is blanket deposited over substrate 12. Dielectric layer 34 may include one or more dielectric layers. In one embodiment, dielectric layer 34 is formed of nitride. In another embodiment, dielectric layer 34 includes a layer of oxide and a layer of nitride over the layer of oxide.

Figure 5:
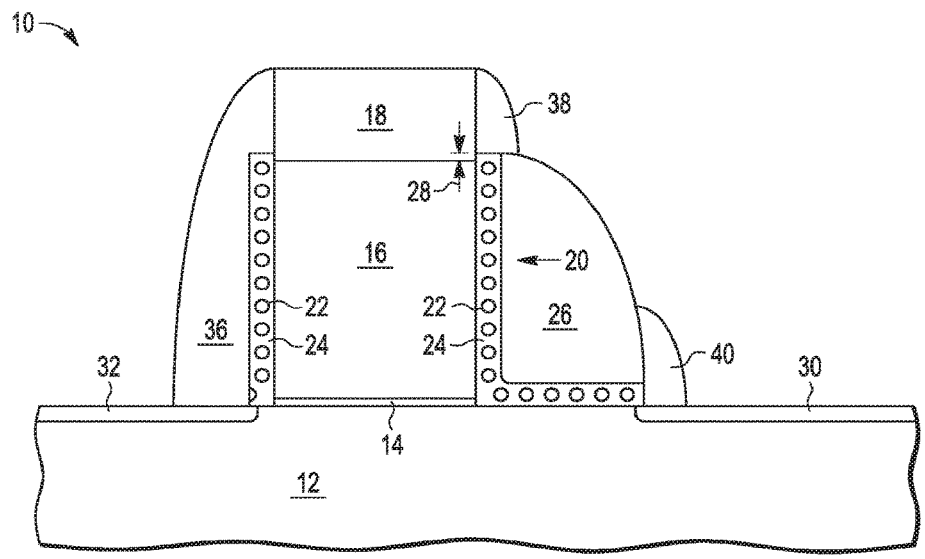
FIG. 5 illustrates the semiconductor device of FIG. 4 at a subsequent stage in processing, in accordance with one embodiment.

FIG. 5 shows a cross-sectional view of semiconductor device 10 during a subsequent stage of manufacture in which sidewall spacers 36, 38, and 40 are formed from dielectric layer 34. In one embodiment, dielectric layer 34 is anisotropically etched to result in sidewall spacers 36, 38, and 40. Sidewall spacer 38 extends along a first sidewall of dielectric layer 18 from the top surface of dielectric layer 18 to a top of control electrode 26. Sidewall spacer 40 extends from a lower surface of control gate 26 at the interface with substrate 12 to a first height along control gate 26, in which the first height is below the top of control gate 26. In one embodiment, a width of spacer 40 at the interface with substrate 12 is in a range of 10 to 30 nanometers. Also, note that a surface of control gate 26 is exposed between the base of spacer 38 and the top of spacer 40. Sidewall spacer 36 extends from the top surface of dielectric layer 18 to substrate 12 along a second sidewall of dielectric layer 18 and the second sidewall of select gate 16.

Figure 6:
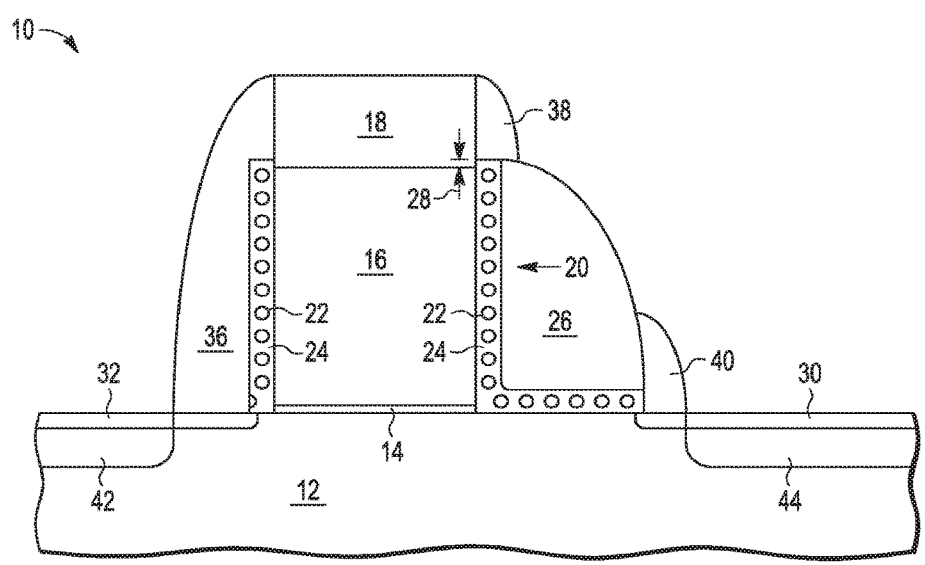
FIG. 6 illustrates the semiconductor device of FIG. 5 at a subsequent stage in processing, in accordance with one embodiment.

FIG. 6 shows a cross-sectional view of semiconductor device 10 during a subsequent stage of manufacture in which an implant is performed using spacers 36 and 40 as implant masks to form deep source/drain regions 42 and 44 in substrate 12. Region 42 is formed in substrate 12 adjacent spacer 36 and extends deeper into substrate 12 than extension region 32. Region 44 is formed in substrate 12 adjacent spacer 40 and extends deeper into substrate 12 than extension region 30. Regions 32 and 42 may collectively be referred to as a source/drain region, and regions 30 and 44 may collectively be referred to as a source/drain region. In one embodiment, regions 30 and 44 form a source region of split gate memory device 10, and regions 32 and 42 form a drain region of split gate memory device 10. Also, note that subsequent heating, which may be performed during subsequent processing steps, may grow regions 32, 30, 42, and 44.

Figure 7:
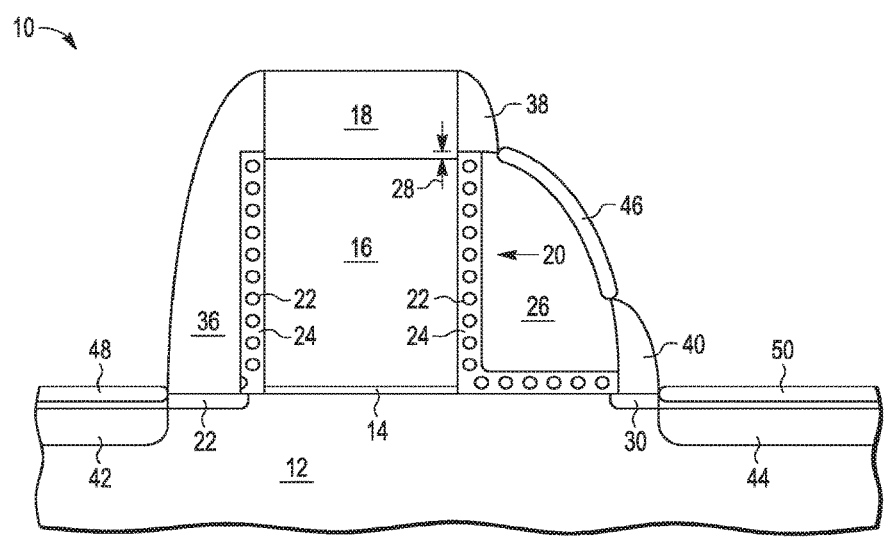
FIG. 7 illustrates the semiconductor device of FIG. 6 at a subsequent stage in processing, in accordance with one embodiment.

FIG. 7 shows a cross-sectional view of semiconductor device 10 during a subsequent stage in manufacture in which a silicide is performed using spacers 38, 40, and 36 as masks to form silicide regions 46, 48, and 50. The exposed portion of control gate 26 between spacers 38 and 40 is silicided to form silicide region 46. Also, the exposed portions of substrate 12 are silicided to form silicide region 48 on the source/drain region formed by regions 32 and 42 and silicide region 50 on the source/drain region formed by regions 30 and 44. In one embodiment, silicide regions 46, 48, and 50 each have a thickness in a range of 10 to 40 nanometers. Note that spacer 38 prevents silicide region 46 from extending to charge storage layer 20, and spacer 40 prevents silicide region 50 from extending to charge storage layer 20. In one embodiment, the top edge of silicide 46, which meets spacer 38, is spaced at least 10 nanometers away from charge storage layer 20. In one embodiment, the gap between charge storage layer 20 and silicide region 46 is in a range of 10 to 20 nanometers. Therefore, spacer 38, which is formed on top of control gate 26, provides for a gap between charge storage layer 20 and silicide region 46. Similarly, spacer 40 provides a gap between the horizontal portion of charge storage layer 20 under control gate 26 and silicide region 50. These gaps may help prevent voltage breakdown.

Referring back to FIG. 1, in an alternate embodiment as was described above, a second spacer (and thus a second control gate electrode) may remain along the second sidewall of select gate 16. In this embodiment, the anisotropic etching of dielectric layer 34 would also form dielectric sidewall spacers similar to spacers 38 and 40 on top of the second control gate and adjacent the second control gate. In this case, upon silicidation, these spacers would ensure that the silicide region formed on the exposed portion of the second control gate would be sufficiently spaced apart from the portion of charge storage layer 20 between the second control gate and select gate 16 and that silicide region 48 would be sufficiently spaced apart from the horizontal portion of charge storage layer 20 between the second control gate and substrate 12.

By now it should be appreciated that there has been provided a split gate memory cell structure which includes a select gate, a sidewall control gate adjacent the select gate, a first dielectric sidewall spacer on the control gate, and a second dielectric sidewall spacer adjacent the control gate on the substrate. The dielectric sidewall spacers provide for gaps or spaces between the charge storage layer of the split gate memory cell structure and silicide regions of the split gate memory cell structures. These gaps or spaces may help prevent voltage breakdown which may occur with split gate memory cell structures which do not include these gaps or spaces.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, a second control gate electrode can be formed adjacent an opposite sidewall of the select gate. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for forming a split gate memory cell structure using a semiconductor substrate, and the method includes: forming a gate stack over the semiconductor substrate, wherein the gate stack has a conductive portion with a top surface and a dielectric portion having a bottom surface on the top surface of the conductive portion, the gate stack having a first sidewall along a side of the conductive portion and a side of the dielectric portion; forming a charge storage layer over the substrate including over the gate stack and along the first sidewall; forming a conductive layer over the charge storage layer; etching the conductive layer to leave a first conductive spacer along the first sidewall, wherein a top of the first conductive spacer is above the top surface of the conductive portion and below the top of the dielectric portion; forming a first sidewall spacer from a lower surface of the first conductive spacer to a first height below the top of the first conductive spacer and a second sidewall spacer along the first sidewall between the top of the first conductive spacer and the top surface of the dielectric portion; and siliciding the first conductive spacer between the first sidewall spacer and the second sidewall spacer. Item 2 includes the method of item 1, and further includes forming a first source/drain extension in the semiconductor substrate using the first conductive spacer as an implant mask prior to forming the first and second sidewall spacers. Item 3 includes the method of item 1, wherein the etching the conductive layer further comprises forming a second conductive spacer along a second sidewall of the gate stack. Item 4 includes the method of item 3, and further includes removing the second conductive spacer prior to forming the first and second sidewall spacers. Item 5 includes the method of item 4, and further includes forming a second source/drain extension in the substrate after removing the second conductive spacer. Item 6 includes the method of item 5, and further includes forming a third sidewall spacer adjacent to the second sidewall. Item 7 includes the method of item 6, and further includes forming a first deep source/drain region in the substrate using the first sidewall spacer as an implant mask and a second deep source/drain region in the substrate using the third sidewall spacer as a mask. Item 8 includes the method of item 7, and further includes siliciding the substrate over the first and second deep source/drain regions. Item 9 includes the method of item 1, wherein the forming the conductive layer is further characterized by the conductive layer comprising polysilicon. Item 10 includes the method of item 1, wherein the forming the gate stack is further characterized by the dielectric portion of the gate stack comprising nitride. Item 11 includes the method of item 1, wherein the forming the first and second sidewall spacers is further characterized by the first and second sidewall spacers comprising nitride. Item 12 includes the method of item 1, wherein the forming the charge storage layer is further characterized by the charge storage layer comprising nanocrystals.

Item 13 includes a split gate memory cell structure, including: a gate stack over a semiconductor substrate, wherein the gate stack has a conductive portion with a top surface and a dielectric portion having a bottom surface on the top surface of the conductive portion, the gate stack having a first sidewall along a first side of the conductive portion and a first side of the dielectric portion; a charge storage layer along a first portion of the first sidewall and extending over a first portion of the substrate; a first sidewall spacer on the charge storage layer along the first portion of the first sidewall and extending over the first portion of the substrate, wherein the first sidewall spacer comprises conductive material and wherein the first portion of the first sidewall includes the first side of the conductive portion and a first portion of the first side of the dielectric portion; a second sidewall spacer on a top portion of the first sidewall spacer and along the first sidewall above the first sidewall spacer, wherein the second sidewall spacer comprises dielectric material; and a silicide layer on a top surface of the first sidewall spacer; wherein the silicide layer adjoins the second sidewall spacer and does not contact the charge storage layer below the dielectric portion. Item 14 includes the split gate memory cell structure of item 13, and further includes a third sidewall spacer on the substrate adjacent to the charge storage layer, wherein the third sidewall spacer comprises dielectric material. Item 15 includes the split gate memory cell structure of item 14, and further includes a fourth sidewall spacer, wherein the fourth sidewall spacer comprises dielectric material. Item 16 includes the split gate memory cell structure of item 13, wherein the conductive portion comprises polysilicon the dielectric portion comprises nitride, the first sidewall spacer comprises polysilicon, and the second sidewall spacer comprises nitride. Item 17 includes the split gate memory cell structure of item 13, and further includes a first source/drain region in the substrate adjacent to the first sidewall spacer and a second source/drain region in the substrate adjacent to a second sidewall of the gate stack. Item 18 includes the split gate memory cell structure of item 13, wherein the first portion of the gate stack is a select gate and the first sidewall spacer is a control gate.

Item 19 includes a method for forming a split gate memory cell structure using a substrate, and the method includes: forming a gate stack comprising a select gate and a dielectric portion overlying the select gate; forming a charge storage layer over the substrate including over the gate stack; forming a first sidewall spacer of conductive material along a first sidewall of the gate stack extending past a top of the select gate; forming a second sidewall spacer of dielectric material along the first sidewall on the first sidewall spacer; and siliciding a portion of the first sidewall spacer using the second sidewall spacer as a mask whereby silicide does not extend to the charge storage layer. Item 20 includes the method of item 19, wherein: the forming the charge storage layer comprises forming a nanocrystal layer; the forming the first sidewall spacer is further characterized by the first sidewall spacer comprising polysilicon; and the forming the second sidewall spacer is further characterized by the second sidewall spacer comprising nitride.

What is claimed is:

1. A split gate memory cell structure, comprising:
    a gate stack over a semiconductor substrate, wherein the gate stack has a conductive portion with a top surface and a dielectric portion having a bottom surface on the top surface of the conductive portion, the gate stack having a first sidewall along a first side of the conductive portion and a first side of the dielectric portion;
    a charge storage layer along a first portion of the first sidewall and extending over a first portion of the substrate;
    a first sidewall spacer on the charge storage layer along the first portion of the first sidewall and extending over the first portion of the substrate, wherein the first sidewall spacer comprises conductive material and wherein the first portion of the first sidewall includes the first side of the conductive portion and a first portion of the first side of the dielectric portion;
    a second sidewall spacer on a top portion of the first sidewall spacer and along the first sidewall above the first sidewall spacer, wherein the second sidewall spacer comprises dielectric material, and wherein a portion of the second sidewall spacer is directly above the first sidewall spacer; and
    a silicide layer on a top surface of the first sidewall spacer; wherein the silicide layer adjoins the second sidewall spacer and does not contact the charge storage layer below the dielectric portion.

2. The split gate memory cell structure of claim 1, further comprising a third sidewall spacer on the substrate adjacent to the charge storage layer, wherein the third sidewall spacer comprises dielectric material.

3. The split gate memory cell structure of claim 2 further comprising a fourth sidewall spacer, wherein the fourth sidewall spacer comprises dielectric material.

4. The split gate memory cell structure of claim 1, wherein the conductive portion comprises polysilicon the dielectric portion comprises nitride, the first sidewall spacer comprises polysilicon, and the second sidewall spacer comprises nitride.

5. The split gate memory cell structure of claim 1, further comprising a first source/drain region in the substrate adjacent to the first sidewall spacer and a second source/drain region in the substrate adjacent to a second sidewall of the gate stack.

6. The split gate memory cell structure of claim 1, wherein the first portion of the gate stack is a select gate and the first sidewall spacer is a control gate.

7. The structure of claim 5, further comprising a second silicide layer over the first source/drain region and a third silicide layer over the second source/drain region.

8. The structure of claim 1, wherein the first sidewall spacer comprises polysilicon.

9. The structure of claim 1 wherein the dielectric portion of the gate stack comprises nitride.

10. The structure of claim 1 wherein the second sidewall spacer comprises nitride.

11. The structure of claim 1, wherein the charge storage layer comprises nanocrystals.

12. A split gate memory cell structure, comprising:

a gate stack over the semiconductor substrate, wherein the gate stack has a conductive portion with a top surface and a dielectric portion having a bottom surface on the top surface of the conductive portion, the gate stack having a first sidewall along a side of the conductive portion and a side of the dielectric portion;

a charge storage layer over the substrate including over the gate stack and along the first sidewall;

a first conductive spacer (26) over the charge storage layer and along the first sidewall, wherein a top of the first conductive spacer is above the top surface of the conductive portion and below the top of the dielectric portion;

a first sidewall (40) spacer extending from a lower surface of the first conductive spacer to a first height below the top of the first conductive spacer;

a second sidewall (38) spacer along the first sidewall between the top of the first conductive spacer and the top surface of the dielectric portion, wherein a portion of the second sidewall spacer is directly above the conductive spacer; and silicide layer (46) on a top surface of the first conductive spacer between the first sidewall spacer and the second sidewall spacer.

13. The method of claim 12 further comprising a first source/drain region in the semiconductor substrate adjacent the first conductive spacer and a second source/drain region in the semiconductor substrate adjacent a second sidewall of the gate stack opposite the first sidewall.

14. The structure of claim 13, further comprising a third sidewall spacer adjacent to the second sidewall.

15. The structure of claim 13, further comprising a second silicide layer over the first source/drain region and a third silicide layer over the second source/drain region.

16. The structure of claim 12, wherein the first conductive spacer comprises polysilicon.

17. The structure of claim 12 wherein the dielectric portion of the gate stack comprises nitride.

18. The structure of claim 12 wherein the second sidewall spacer comprises nitride.

19. The structure of claim 12, wherein the charge storage layer comprises nanocrystals.

* * * * *